United States Patent [19]

Rutz

[11] 4,152,182
[45] May 1, 1979

[54] PROCESS FOR PRODUCING ELECTRONIC GRADE ALUMINUM NITRIDE FILMS UTILIZING THE REDUCTION OF ALUMINUM OXIDE

[75] Inventor: Richard F. Rutz, Cold Spring, N.Y.

[73] Assignee: International Business Machines Corporation, Armonk, N.Y.

[21] Appl. No.: 905,625

[22] Filed: May 15, 1978

[51] Int. Cl.² .................... H01L 21/205; H01L 21/86
[52] U.S. Cl. .................................. 148/175; 148/1.5;
148/174; 156/612; 156/614; 156/DIG. 61;
156/646; 156/656; 156/667; 252/62.3 GA;
423/406; 423/412; 357/4
[58] Field of Search ............... 148/1.5, 174, 175;
156/612, 614, DIG. 61, 70, 646, 656, 667;
423/406, 409, 412; 252/62.3 GA; 357/4

[56] References Cited

U.S. PATENT DOCUMENTS

| | | | |
|---|---|---|---|
| 2,962,359 | 11/1960 | Perieres et al. | 423/412 |
| 3,092,455 | 6/1963 | Paris et al. | 423/412 |
| 3,128,153 | 4/1964 | Addamiano | 423/412 |
| 3,291,657 | 12/1966 | Sirtl | 148/175 |
| 3,307,908 | 3/1967 | Mandorf | 423/412 |
| 3,461,004 | 8/1969 | Lochner et al. | 148/175 |
| 3,577,285 | 5/1971 | Rutz | 148/175 |
| 3,589,936 | 6/1971 | Tramposch | 156/612 |
| 4,008,111 | 2/1977 | Rutz | 156/656 |

OTHER PUBLICATIONS

Cuomo et al., "Growing . . . Aluminum Nitride Crystals" I.B.M. Tech. Discl. Bull., vol. 17, No. 9, Feb. 1975, pp. 2819–2820.
Rutz, R. F., "Ultraviolet . . . AlN" Applied Physics Letters, vol. 28, No. 7, 1 Apr. 1976, pp. 379–381.
Slack et al., "Growth of High Purity AlN Crystals" J. Crystal Growth, vol. 34, 1976, pp. 263–279.

Primary Examiner—L. Dewayne Rutledge
Assistant Examiner—W. G. Saba
Attorney, Agent, or Firm—Alvin J. Riddles

[57] ABSTRACT

Electronic grade aluminum nitride semiconductor material may be uniformly nucleated and epitaxially formed on an aluminum oxide substrate by reacting aluminum oxide or aluminum nitride with nitrogen in the presence of carbon.

3 Claims, 5 Drawing Figures

POSITION CARBON AND Al$_2$O$_3$ SOURCE IN CONVECTION PROXIMITY TO Al$_2$O$_3$ CRYSTAL SUBSTRATE

↓

HEAT IN PRESENCE OF NITROGEN

↓

INTRODUCE CONDUCTIVITY TYPE DETERMINING IMPURITIES

PROCESS FOR PRODUCING ELECTRONIC GRADE ALUMINUM NITRIDE FILMS UTILIZING THE REDUCTION OF ALUMINUM OXIDE

TECHNICAL FIELD

Aluminum nitride is a strong refractory material that has recently been found to exhibit the shortest wavelength electroluminesence and photoluminescent properties. However, being a high temperature material, aluminum nitride in order to have good electroluminescent and other device properties requires formation and fabrication at temperatures that are so high that many of the materials involved in the fabrication react and introduce deleterious properties into its electronic behavior.

BACKGROUND ART

In an article entitled, Ultraviolet Electroluminesence in Aluminum Nitride, Applied Physics Letters, Vol. 28, No. 7, April 1976 n-type conductivity conducting aluminum nitride was described as being grown on sapphire substrates at high temperatures in excess of 1800° C. The technique that was employed while successful in producing aluminum nitride, required a nucleating layer on the sapphire substrate and the nucleating layer had to be formed at a substantially different temperature in a different piece of equipment, further a presynthesized sintered source of aluminum nitride was required.

In U.S. Pat. No. 3,634,149 aluminum nitride is reported to have been grown on silicon carbide substrates in a temperature range of 1800°-2300° C. In this instance the source material for the growth of the aluminum nitride is presynthesized aluminum nitride and further carbide crystals which are difficult to reproducibly grow in useful sizes appear to be the only reproducible substrate for this method. Extensive literature exists on the growth of aluminum nitride on sapphire and other substrates at low temperatures in the vicinity of 1500° C. by vapor transport using chlorine or fluorine compounds and plasma techniques. This literature is reported in the review article in the Journal of Crystal Growth, Vol. 34, p. 263, 1976. The electronic properties, however, of low temperature grown aluminum nitride have not been satisfactory for device use. The properties appear to be very high resistance in the vicinity of $10^{13}$ ohms per cm and the layers grown in many cases appear to have a tendency to craze or crack and sometimes peel from the substrate.

BEST MODE FOR CARRYING OUT THE INVENTION

What has been discovered is a technique of synthesizing and growing epitaxially aluminum nitride directly on a $Al_2O_3$ sapphire substrate at a high temperature and wherein conductivity determining impurities in the proper concentrations can be incorporated, thereby producing electronic grade aluminum nitride material with suitable properties for device uses. Sapphire is employed both as a substrate and as a source, with care taken to control the tendency of the sapphire to decompose. The sapphire seed crystal has only one surface exposed to the gaseous vapors containing Al and N in a temperature gradient so that complete and uniform nucleation as the temperature is elevated to the growing temperature to protect the substrate sapphire from etching or decomposing such as is occurring at the source sapphire.

DISCLOSURE OF INVENTION

In accordance with the invention what has been discovered is a technique of growing the proper resistivity and conductivity aluminum nitride layers epitaxially, directly onto a sapphire single crystal substrate by decomposing aluminum oxide in the presence of hydrogen and carbon to form the aluminum nitride. The growth reaction is believed to proceed as follows:

Equation 1:

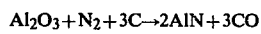

$$Al_2O_3 + N_2 + 3C \rightarrow 2AlN + 3CO$$

Reacted in the presence of 15% $H_2$

The role of $H_2$ is not completely understood although it is believed to have a cleansing effect in keeping the reactor free of oxides.

Equation 1 is considered to be the well-known Serpek process and in connection with the structural arrangement for growth will provide electronic grade n-type conductivity aluminum nitride which can be reproducibly epitaxially grown on a single crystal sapphire substrate at refractory temperatures.

Figure 1:
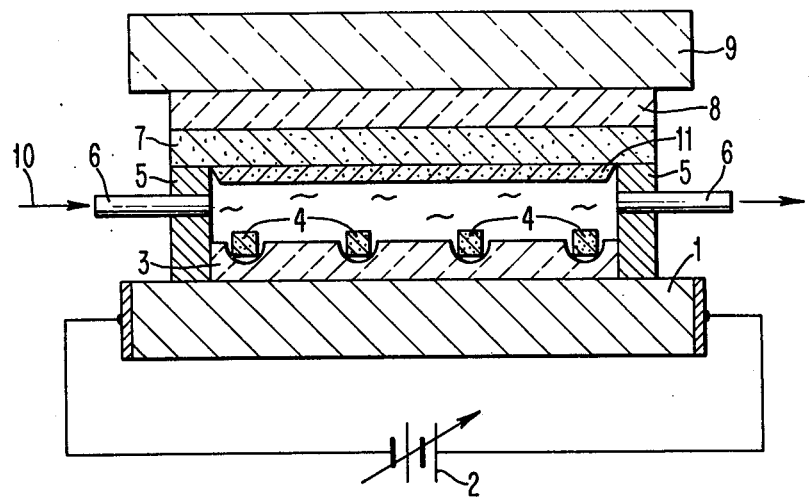
FIG. 1 is a schematic of a structure in which the epitaxial growth of the aluminum nitride is practiced.

Referring to FIG. 1 a schematic of a typical structure for practicing the invention is set forth wherein a heater 1 of, for example tungsten, which is driven by a power source 2 shown schematically as a battery, provides the source of increased temperature. The carbon in equation 1 is provided by a pyrolytic graphite type carbon source 3 in contact with the heat 1. The $Al_2O_3$ or sapphire source for Equation 1 is provided by source pieces 4 shown mounted in depressions in the pyrolytic graphite source 3. Supporting sides 5 having therein gas ports 6 are shown supporting the substrate 7 of single crystal aluminum oxide or sapphire at a fixed distance from the sources 4. A pyrolytic heat absorber of carbon or tungsten 8 and a felt insulator 9 are provided to confine the source of heat to the area of the reaction and to reduce stresses in the single crystal sapphire substrate 7.

In operation a gas 10, preferably of nitrogen of the forming gas composition with an addition of a few milliliters per second of ammonia is introduced into the reaction region between the substrate 7 and the sources 4 through the gas port 6 with overflow out the opposite side. For a reactor chamber of 0.375 inch width, a 0.500 inch length and a 0.120 inch height, a flow of 200 milliliters per minute can be used. The sapphire source can be 0.020 inch to 0.080 inch spaced below the growing AlN 11.

In operation, the electronic grade aluminum nitride grows epitaxially as element 11 on the substrate 7. When the reaction of Equation 1 is in progress, the substrate is maintained at 1670°-1870° C. while the source sapphire pieces 4 are heated to between 1900° and 2000° C. The epitaxially grown region 11 is n-type conductivity aluminum nitride in the vicinity of $10^5$ ohm C. To obtain electroluminesence and other device properties the effect of the high resistivity can be overcome by operating at 150° C. to 500° C. or by overgrowing with a low resistance AlN layer by heating in contact with an AlN sintered source at 1850° C. in the presence of a gas that is 85% N-15% $H_2$. The layer 11 may then be subjected to further processing to change the conductivity and luminescent spectrum by the standard semiconductor techniques of diffusion and ion implantation well known in the art.

Figure 2:
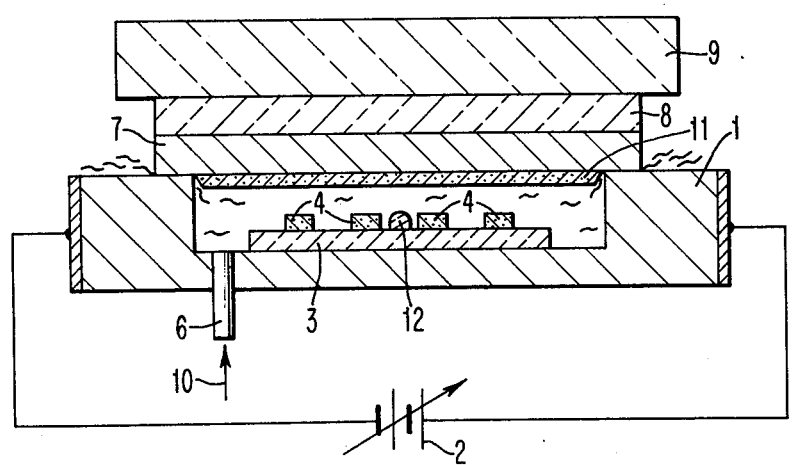
FIG. 2 is a schematic of a structure for the growth of aluminum nitride with provision for the introduction of conductivity determining impurities.

Referring next to FIG. 2 a structure is shown for growing an epitaxial aluminum nitride layer 11 directly on an aluminum oxide substrate 7 while arranging the conductivity and resistivity by appropriate introduction of impurities during the growth.

In FIG. 2 a confined configuration is arranged wherein the sapphire aluminum oxide substrate 7 fits as loose lid over an opening in the heater 1. This construction permits close spacing in between the carbon source 3 which supports the aluminum oxide source pieces 4 and the growing film 11. A tungsten or carbon heat absorber 8 and carbon felt insulator 9 are provided for heat confinement and coefficient of expansion purposes as in FIG. 1.

In FIG. 2 the $N_2+15\%$ hydrogen gas of Equation 1 is supplied through element 6. In this structure the substrate 7 is positioned as a loosely fitting lid provides slow and uniform growth of the layer 11, the rate being limited essentially by the introduction of the nitrogen forming gas mixture into the reaction chamber and the diffusion of $CO_2$ and other unused gaseous products out of the chamber, as is illustrated as a gaseous effluent at the intersection of the heater 1 and the substrate. The substrate 7 is maintained at 1670°–1870° C. and the source sapphire 4 is maintained at 1900°–2000° C. At these temperatures when the source 4 to substrate 7 spacing of about 2 mm is maintained, the growth rate is on the order of ½ of micrometer per minute. Under these conditions conductivity determining impurities can be introduced from refractory materials that decompose in the vicinity of 1900° C. These are placed in the reaction chamber and are shown schematically as element 12. Spinel which is $MgAl_2O_4$ is a satisfactory material. It contains magnesium that is released slowly and is incorporated into the grown aluminum nitride. Magnesium is indicated to be a p-type dopant. In lower concentrations this raises the conductivity higher than $10^5$ ohm cm. A refractory oxide such as beryllium oxide and refractory nitrides such as those of neodynium, beryllium or silicon are also suitable. The addition of impurities can be used to change the luminescent properties and enhance the luminesence in the yellow and green portion of the spectrum.

Figures 3, 4:
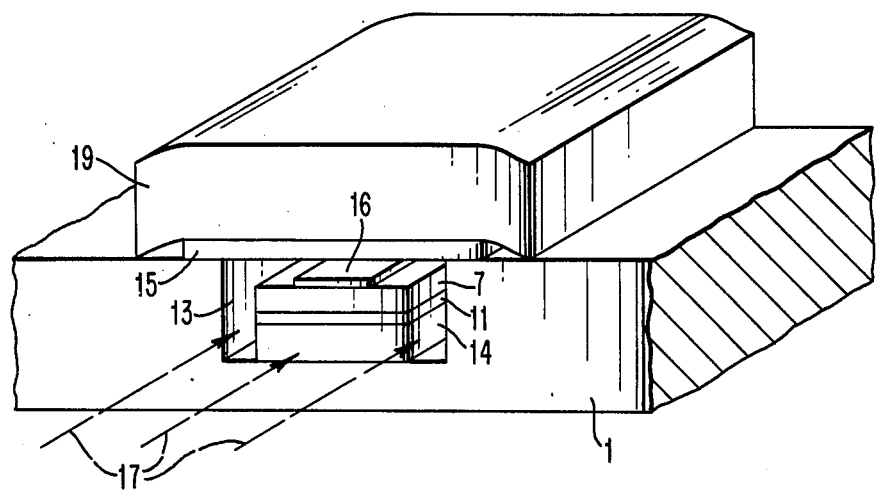
FIG. 3 is a schematic of a structure for the growth of aluminum nitride with provision for etching away a portion of the substrate during growth.
FIG. 4 is a flowchart of the process of growing the aluminum nitride electronic grade material.

Referring next to FIG. 3 an apparatus is shown for etching away all or a portion of the aluminum oxide sapphire substrate 7 shown in the previous two figures. There are electronic device applications where the stresses and coefficient of expansion mismatch between the aluminum oxide substrate on which the aluminum nitride 11 must be grown and the aluminum nitride 11 is such that it is desirable to get rid of the aluminum oxide 7 when the growing has taken place thereby preventing stresses in the grown layer as it cools.

In FIG. 3 the tungsten heater shown as element 1 has a cavity 13 in which the substrate 7 with the grown region of aluminum nitride 11 is positioned on an aluminum nitride sintered substrate 14, a tungsten lid 15 and carbon felt heat retainer 9 are spaced from the substrate by a carbon stripe 16. With this structure the aluminum oxide substrate 7 at the growth temperature of 1800° C. can be etched away by changing the gaseous atmosphere that has been introduced through elements 6 of the previous two figures to a new gas 17 capable of attacking aluminum oxide at a very much faster rate than aluminum nitride. An example of such a gas is argon forming gas containing 75% argon and 15% hydrogen. Other suitable materials are aluminum vapors and propane gas. Since carbon will etch or decompose aluminum oxide at these temperatures, the removal can be expedited by adding the carbon shown as element 16 to the system.

The structure of FIGS. 1, 2 and 3 can use sintered aluminum nitride as the source. In FIG. 3 by introducing nitrogen forming gas as element 17 at 1900° for 30 minutes a 1 micrometer thick aluminum nitride crystal layer 11 will form on a 5 mm thick C axis sapphire substrate 7. At this point the gas 17 is then switched to argon forming gas for another 1 to 2 hours at which time a 5 mil thick sapphire 7 substrate has been etched away. The dimensions of the cavity 13 may be 0.375 inch wide, 0.080 inch high and 0.500 inch long.

Referring next to FIG. 4 a flowchart is provided which illustrates the process of applicant's invention.

In FIG. 4 in step 1 the materials carbon and an aluminum oxide source are positioned in convection proximity to an aluminum oxide crystal substrate. In step 2 the combination is heated in the presence of nitrogen, which, in accordance with Equation 1 decomposes the aluminum oxide and with the assistance of the carbon, aluminum nitride is epitaxially or epiaxially grown on the aluminum oxide. Where it is desirable in the process of growth to also introduce conductivity determining impurities, step 3 is performed and in the presence of heat the conductivity determining impurity is included in the chamber and incorporated in the aluminum nitride in connection with the growth.

Figure 5:
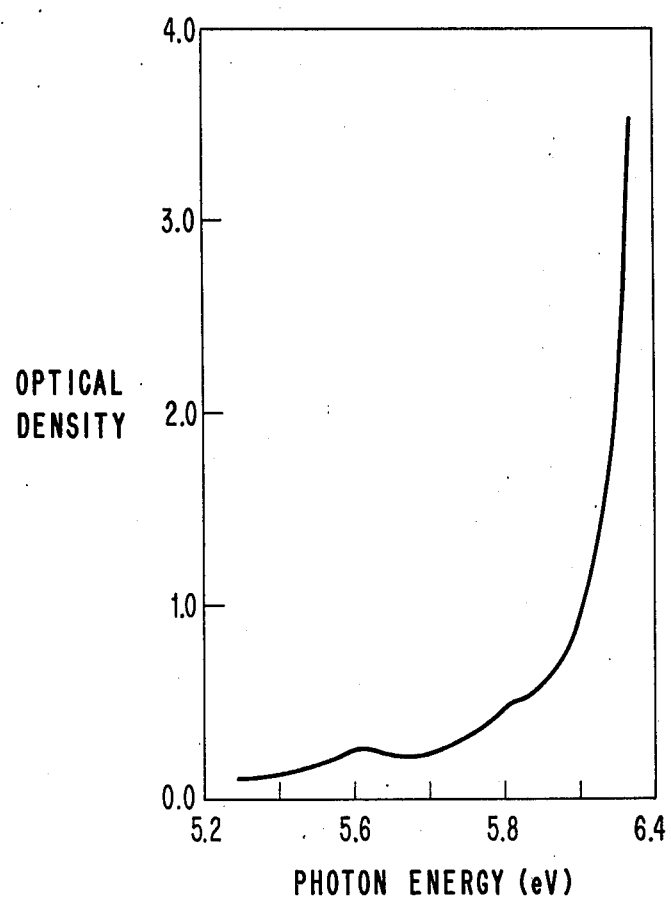
FIG. 5 is a graph of the optical absorption properties of the electronic grade aluminum nitride material.

Referring next to FIG. 5 there is shown a graph of the optical absorption properties of a 0.4 micrometer thick aluminum nitride $11\overline{2}0$ crystallographically oriented crystalline film grown on a $01\overline{1}2$ crystallographically oriented sapphire substrate. The growth was at 1750° C. from a sintered AlN source with approximately 200 micrograms of carbon present in the reactor of FIG. 1 to promote uniform nucleation of AlN directly on the sapphire. The AlN film 11 grows smoothly and undesirable optically absorbing impurities are minimized. In FIG. 5 the optical density at the short wavelength edge, that is at the high electron volt region in the diagram, shows that the AlN material has a direct band gap and hence is suitable for a laser device when pumped with a source at a wavelength corresponding to an energy of 6.28 eV at 4° K. or 6.2 eV at room temperature. One readily available source is an electron beam of several thousand volts energy.

In a laser device the AlN film 11 of FIG. 1 could be from 2 to 30 micrometers thick to allow many wavelengths of the lasing wavelength in the fabry-perot cavity formed between the sapphire substrate 7 and the surface of the film 11. The film is placed on the inner face of an electron beam gun assembly and may be coated with a thin metallic film transparent to electrons to increase the optical reflectivity. In this application low resistivity is of lesser importance and the absence of unwanted impurities is of greater importance. The growth technique of this invention provides the desired purity.

What has been described is the technique for the fabrication of electronic grade aluminum nitride wherein an apparatus and a process result in a technique wherein at the extremely high temperatures electronic device quality material can be grown with the appropriate impurities therein. The method provides for uniform nucleation on polished sapphire substrates so that integral films as thin as a few hundred angstroms can be grown.

Having described the invention, what is claimed as new and what is desired to secure by Letters Patent is:

1. The process of epitaxially forming electronic grade aluminum nitride on an aluminum oxide substrate comprising the steps of:

positioning carbon and a source of aluminum oxide in convection proximity to an aluminum oxide crystal substrate, heating said substrate to a temperature of at least 1670° C. and said source to a temperature of at least 1900° C. while passing a gaseous mixture comprising nitrogen an hydrogen past said source and said substrate, applying heat for the duration of the formation of an aluminum nitride film on said aluminum oxide crystal substrate.

2. The process of claim 1 wherein ammonia is added to said gaseous mixture.

3. The process of claim 1 including the step of heating in the presence of a conductivity determining impurity.

* * * * *